US 6,578,185 B1

(12) United States Patent
Kelly

(10) Patent No.: US 6,578,185 B1
(45) Date of Patent: Jun. 10, 2003

(54) POWER-SUPPLY-CONFIGURABLE OUTPUTS

(75) Inventor: James E. Kelly, Starkville, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 69 days.

(21) Appl. No.: 09/728,347

(22) Filed: Dec. 1, 2000

Related U.S. Application Data

(60) Provisional application No. 60/173,812, filed on Dec. 30, 1999.

(51) Int. Cl.[7] ............................................... G06F 17/50
(52) U.S. Cl. .................. 716/16; 716/1; 716/17; 326/38; 326/62; 326/80; 326/81; 326/86; 327/112; 327/178; 327/530; 365/51; 365/189.09; 365/205; 365/230.03
(58) Field of Search .................... 716/1–21; 365/189.09, 365/230.03, 205, 51; 361/111; 326/81, 38, 62, 102, 27, 80; 327/328, 112, 530; 438/18; 713/324

(56) References Cited

U.S. PATENT DOCUMENTS

| 5,132,555 A | * | 7/1992 | Takahashi .................... 326/102 |
| 5,574,397 A | * | 11/1996 | Tomishima et al. ......... 327/530 |
| 5,666,071 A | | 9/1997 | Hawkins et al. .............. 326/86 |
| 6,144,542 A | * | 11/2000 | Ker et al. .................... 361/111 |
| 6,294,943 B1 | * | 9/2001 | Wall et al. ................... 327/328 |

OTHER PUBLICATIONS

MACH110–12/15/20 High–Density EE CMOS Programmable Logic, May 1995, pp. 1–28.

* cited by examiner

Primary Examiner—Vuthe Siek
Assistant Examiner—Helen Rossoshek
(74) Attorney, Agent, or Firm—Christopher P. Maiorana, P.C.; Robert M. Miller

(57) ABSTRACT

An apparatus comprising one or more output circuits each configured to configure a pad as either an input/output pad, a power pad, or a ground pad in response to a plurality of configuration inputs.

20 Claims, 4 Drawing Sheets

POWER-SUPPLY-CONFIGURABLE OUTPUTS

This application claims the benefit of U.S. Provisional Application No. 60/173,812, filed Dec. 30, 1999 and is hereby incorporated by reference in its entirety.

FIELD OF THE INVENTION

The present invention relates to noise suppression generally and, more particularly, to power-supply configurable outputs for decreasing noise excursions on internal power busses for output drivers.

BACKGROUND OF THE INVENTION

Switching output transistors at high speeds. can introduce noise on the output power supply nodes of an integrated circuit. Switching high currents can also introduce noise. Noise excursions on the internal output supply nodes degrade the performance of MOS output transistors during high speed and high current conditions.

One conventional method of reducing noise on the internal output supply nodes is to increase the number of dedicated supply pins. However, increasing the number of dedicated supply pins decreases the number of available data and control pins.

SUMMARY OF THE INVENTION

The present invention concerns an apparatus comprising one or more output circuits. The output circuits may be configured to configure a bond pad as either an input/output pad, a power pad, or a ground pad in response to a plurality of configuration inputs.

The objects, features and advantages of the present invention include providing a method and/or architecture that may (i) suppress excursions on an internal output power supply node, (ii) optimize performance by implementing power-supply-configurable outputs and I/Os and/or (iii) allow a user to reduce internal noise effects when operating in a high-speed and/or high-current system.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
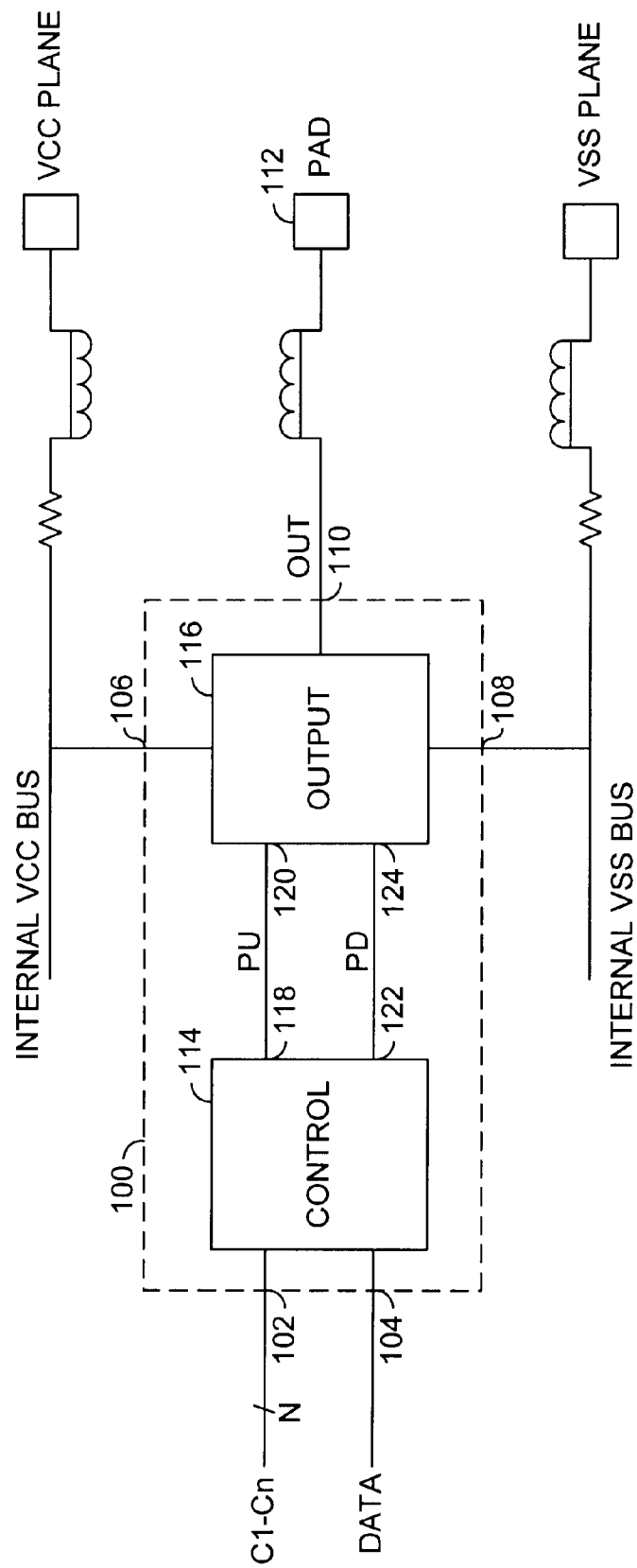
FIG. 1 is a block diagram illustrating a preferred embodiment of the present invention.

Referring to FIG. 1, a block diagram of a circuit 100 is shown in accordance with a preferred embodiment of the present invention. The circuit 100 may be implemented, in one example, as a power-supply configurable output driver. The circuit 100 may be implemented, in another example, as an output driver portion of an input/output buffer. The circuit 100 may have an input 102 that may receive a number of configuration signals (e.g, C1–CN), an input 104 that may receive a signal (e.g., DATA), a terminal (connection) 106 that may be connected to a first internal output power supply node (e.g., VCC), a terminal .(connection) 108 that may be connected to a second internal output power supply node (e.g., VSS), and an output 110 that may present, in one example, a signal (e.g., OUT) to a pad 112. The pad 112 may be, in one example, an I/O pad (pin) of an integrated circuit. The circuit 100 may configure the pad 112 as (i) an output pad, (ii) a power pad, or (iii) a ground pad in response to the signals C1–CN. The pad 112 may be connected to (i) an external device or (ii) an external voltage supply plane (e.g., VCC or VSS).

The circuit 100 may comprise a circuit 114 and a circuit 116. The circuit 114 may be implemented, in one example, as a control circuit. The circuit 116 may be implemented, in one example, as an output circuit. The signals C1–CN and DATA are generally presented to inputs of the circuit 114. The circuit 114 may have (i) an output 118 that may present a signal (e.g., PU) to an input 120 of the circuit 116 and (ii) an output 122 that may present a signal (e.g., PD) to an input 124 of the circuit 116. The circuit 114 may be configured to generate the signals PU and PD in response to the signals C1–CN and DATA. The signals C1–CN may be generated, in one example, using combinational logic in a macrocell. However, any other appropriate control circuit may be implemented accordingly to meet the design criteria of a particular application.

When the I/O pad 112 is connected to the external VCC supply plane (e.g., used as a power pin), the circuit 114 generally forces the signals PU and PD toward VSS (e.g., LOW). When the I/O pad 112 is connected to the external VSS supply plane (e.g., used as a ground pin), the circuit 114 generally forces the signals PU and PD toward VCC (e.g., HIGH). When the I/O pad 112 is used as an output, the signals PU and PD may swing between the supply voltages VCC and VSS in response to the signal DATA. The signals PU and PD will generally have similar timing characteristics. However, the signals PD and PU may change states at different rates to avoid crowbar currents.

When the pad 112 is used as an output pad, the circuit 116 is generally configured to generate the signal OUT in response to the signals PU and PD. When the pad 112 is used as a power pad, the circuit 116 generally connects the output 110 to the internal VCC bus terminal 106 in response to the signals PU and PD. When the pad 112 is used as a ground pad, the circuit 116 generally connects the output 110 to the internal VSS bus terminal 108 in response to the signals PU and PD.

In the example of a CMOS output driver, the signal PU is generally logically equal to the signal PD. Separate paths may be implemented for the signals PU and PD to control (e.g, minimize) crowbar current. In one example, the number of configuration signal may be two (e.g., C1 and C2). The configuration signals C1 and C2 may be combined with the signal DATA so that PU is generally equal to PD. An example of such a combination may be illustrated by the following TABLE 1:

TABLE 1

| C1 | C2 | DATA | PU=PD |
|----|----|------|-------|
| 0  | 0  | 0    | 1     |
| 0  | 0  | 1    | 0     |
| 0  | 1  | 0    | 1     |
| 0  | 1  | 1    | 1     |
| 1  | 0  | 0    | 0     |
| 1  | 0  | 1    | 0     |
| 1  | 1  | 0    | 1     |
| 1  | 1  | 1    | 0     |

The number of configuration bits may be increased according to meet the design criteria of a particular implementation. For example, a portion (e.g., one or more component transistors) of a transistor M1, shown in more detail in connection with FIG. 4, may me turned on at different rates (e.g, sequentially).

Figure 2:
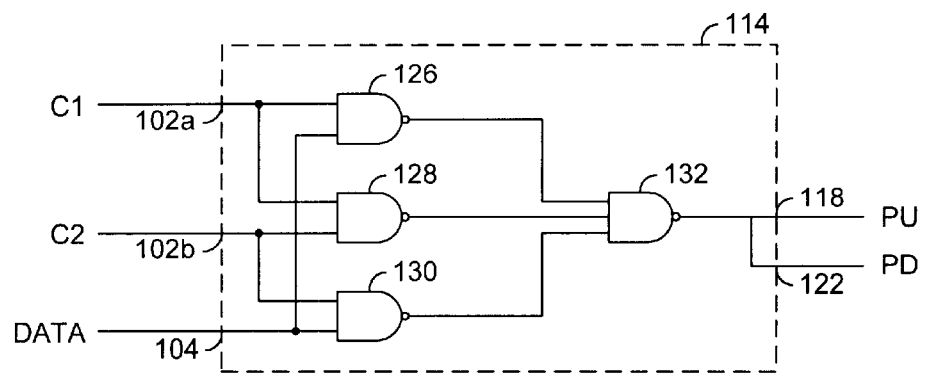
FIG. 2 is a schematic diagram illustrating a control circuit of FIG. 1.

Referring to FIG. 2, a schematic diagram illustrating an exemplary embodiment of the circuit 114 is shown. The circuit 114 may comprise, in one example, a two-input NAND gate 126, a two-input NAND gate 128, a two-input NAND gate 130, and a three-input NAND gate 132. However, other types, numbers, and configurations of gates may be implemented to meet the design criteria of a particular application. A first configuration signal (e.g., C1) may be presented to a first input of the gate 126 and a first input of the gate 128. A second configuration signal (e.g., C2) may be presented to a second input of the gate 128 and a first input of the gate 130. The signal DATA may be presented to a second input of the gate 126 and a second input of the gate 130. The gate 132 may have an input that may receive a signal from an output of the gate 126, an input that may receive a signal from an output of the gate 128, and an input that may receive a signal from an output of the gate 130. The gate 132 may have an output that may be configured, in one example, to generate the signals PU and PD.

Figure 3:
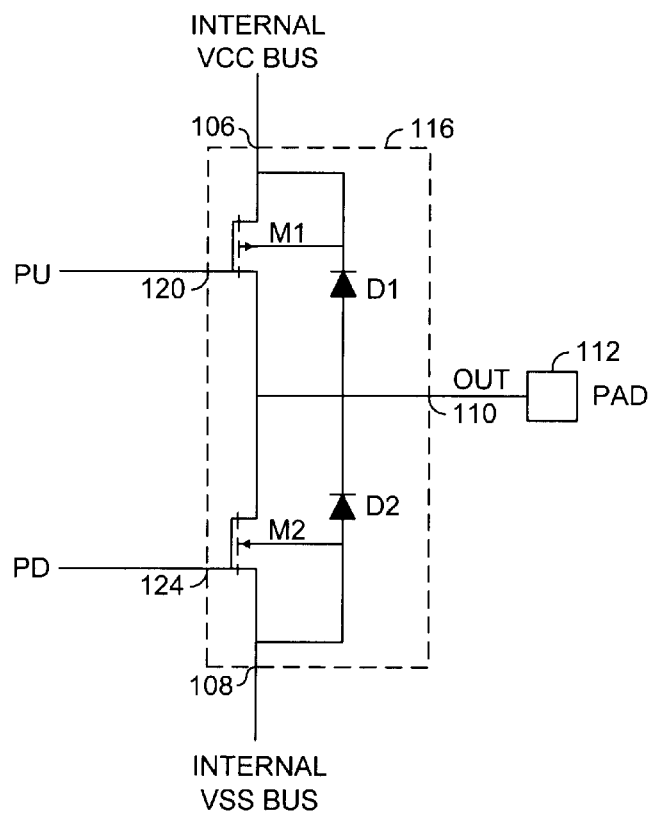
FIG. 3 is a schematic diagram illustrating an embodiment of an output circuit of FIG. 1.

Referring to FIG. 3, a schematic diagram illustrating a preferred embodiment of the circuit 116 is shown. The circuit 116 may comprise, in one example, a transistor M1, a transistor M2, a diode D1, and a diode D2. The transistor M1 may be implemented, in one example, as one or more PMOS enhancement mode transistors. The transistor M2 may be implemented, in one example, as one or more NMOS enhancement mode transistors. However, other types and polarities of transistors may be implemented accordingly to meet the design criteria of a particular application. The diodes D1 and D2 may be implemented, in one example, as PN junction diodes. However, other diode implementations (e.g., a diode coupled transistor) may be used accordingly to meet the design criteria of a particular application. The signal PU may be presented to a gate of the transistor M1. The signal PD may be presented to a gate of the transistor M2. A source of the transistor M1 may be connected to (i) a substrate terminal (or n-well) of the transistor M1, (ii) a cathode of the diode D1, and (iii) the internal output supply node VCC. A drain of the transistor M1 may be connected to (i) a drain of the transistor M2, (ii) an anode of the diode D1, (iii) a cathode of the diode D2, and (iv) the pad 112. A source of the transistor M2 may be connected to (i) a substrate terminal of the transistor M2, (ii) an anode of the diode D2, and (iii) the internal output supply node VSS.

Figure 4:
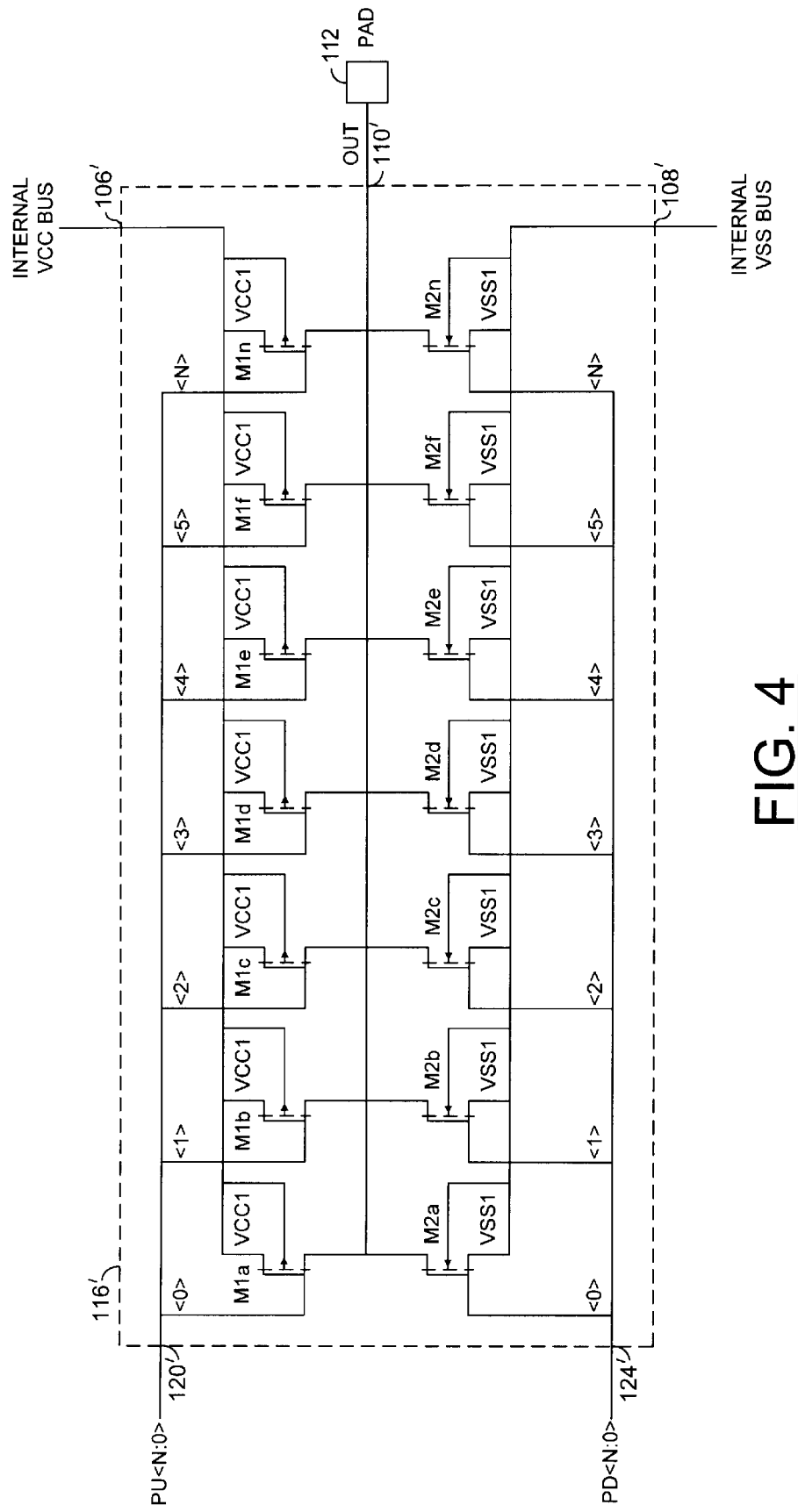
FIG. 4 is a schematic diagram illustrating an alternative embodiment of the output circuit of FIG. 1.

Referring to FIG. 4, a schematic diagram of a circuit 116' illustrating an alternative embodiment of the circuit 116 is shown. The circuit 116' may be configured to generate the signal OUT in response to a number of first control signals (e.g., PU<N:0> where N is an integer) and a number of second control signals (e.g., PD<N:0> where N is an integer). The number of first control signals PD<N:0> and the number of second control signals PD<N:0> may be implemented as individual bits of a first and a second multi-bit signal, respectively. In one example, N may be six. The circuit 116' may comprise a number of PMOS transistors M1a–M1n and a number of NMOS transistors M2a–M2n). A source of the transistors M1a–M1n may be connected to (i) a substrate terminal of the transistors M1a–M1n and (ii) the internal output supply node VCC. A drain of the transistors M1a–M1n may be connected to (i) a drain of the transistors M2a–M2n and (ii) the pad 112. A source of the transistors M2a–M2n may be connected to (i) a substrate terminal of the transistors M2a–M2n and (ii) the internal output supply node VSS. Each gate of the transistors M1a–M1n may receive one of the control signals PU<N:0>. Each gate of the transistors M2a–M2n may receive one of the control signals PD<N:0>. When the pad 112 is used as an output pad, the signals PU<N:0> and PD<N:0> may be used to determine the number of the transistors M1a–M1n and M2a–M2n that may be on at a time. When the pad 112 is used as a power pad, all of the transistors M1a–M1n or M2a–M2n are generally turned on to minimize resistance. However, fewer transistors may be used to meet the design criteria of a particular application. Also, the transistors may be switched ON and/or OFF sequentially.

Figure 5:
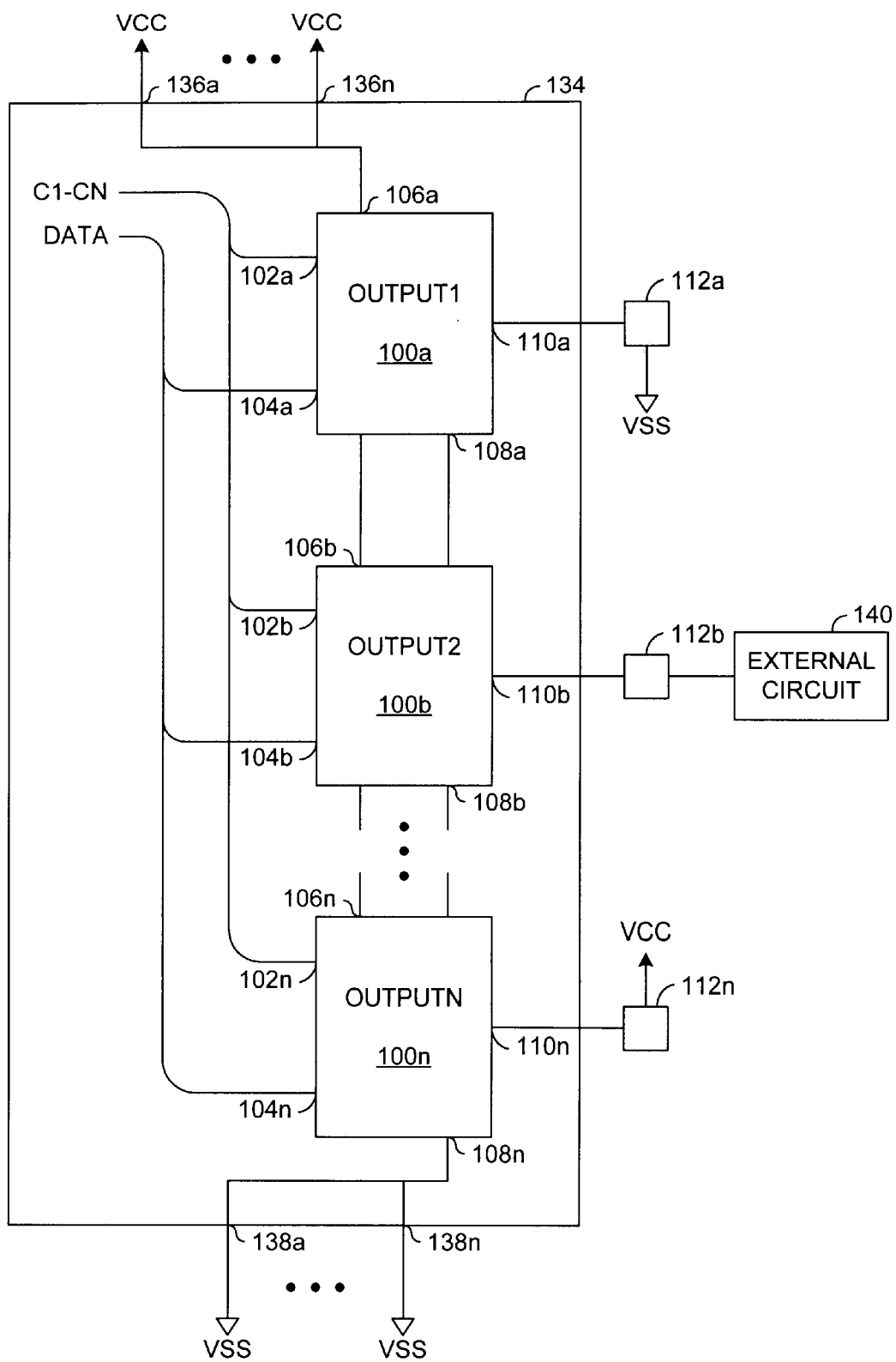
FIG. 5 is a block diagram illustrating an implementation of the circuit of FIG. 1 in accordance with the present invention.

Referring to FIG. 5, a block diagram illustrating the circuit 100 implemented in an integrated circuit 134 is shown. The circuit 134 may be implemented, in one example, as a programmable logic device (PLD). In another example, the circuit 134 may be implemented as a memory device (e.g., a RAM, a PROM, an EPROM, etc.) or any other integrated circuit where additional power pins may be advantageous. The integrated circuit 134 may comprise a number of circuits 100a–100n, a number of output pads 112a–112n, a number of inputs 136a–136n that may be connected to the power supply VCC, and a number of inputs 138a–138n that may be connected to the ground potential VSS. The circuits 100a–100n may be implemented similarly to the circuit 100 described above. Each of the circuits 100a–100n may be independently configured to meet the design criteria of a particular application. For example, (i) the circuit 100a may be configured to use the pad 112a as a ground pad that may be connected to the supply VSS, (ii) the circuit 100b may be configured to use the pad 112b as an output pad that may present a signal to an input of an external circuit 140, (iii) the circuit 100n may be configured to use the pad 112n as a power pad that may be connected to the supply VCC, etc.

The present invention may provide a method and/or apparatus for configuring otherwise unused output driver transistors of unused output ports or I/O ports as active clamps between external output VCC/VSS supplies and internal output VCC/VSS supplies. Implementation of the present invention may suppress noise excursions on the internal output power supply nodes. In order to reduce and/or dampen noise on the internal power busses used for output drivers, the appropriate output driver transistors may be enabled so as to provide an active transistor clamp. Connecting the appropriate external supply voltage to the pad may provide a PN diode clamp between the external supply voltage and the appropriate internal supply node. The transistors and diodes may (i) reduce noise excursions on the internal power supply nodes and/or (ii) reduce voltage drops under high-current conditions. The further the unused output is located from a supply pin, the greater the effect may be. Multiple unused outputs may provide a greater benefit.

The present invention may be implemented on any device that has otherwise unused outputs that are configurable to always connect an output pad through a MOS device to one of the internal output supply nodes. For example, many memory devices may have otherwise unused outputs that may be configured as noise suppression circuits.

The present invention may be implemented on a programmable logic device (PLD) without requiring additional logic or configuration space. A similar effect to the circuit 100 may be accomplished, in one example, by (i) programming an I/O macrocell as combinatorial, (ii) forcing the logic to always be a logical "1" or a logical "0", and (iii) connecting the I/O pad to the appropriate external supply. The additional cost for this method is the loss of the logic path needed to implement the logical "1" and logical "0".

The present invention may be implemented in RAM products. If the RAM word width is greater than the system data word width, the unused I/Os may be connected to VCC or VSS. However, the entire memory space generally must be written before attempting a read operation. In order to avoid writing the entire memory space before a read operation, additional logic or fuse options could be added to the RAM to configure the unused outputs as noise suppression circuits.

Power-supply-configurable outputs and I/Os may allow the performance of a device to be optimized for each unique design by reducing internal noise effects when operating in high-speed and/or high-current systems.

The present invention may be highly valuable in PLDs and t memory devices having a small number of power supply pins versus available outputs and I/Os.

The various signals have been described generally "on" (e.g., a digital HIGH, or 1) and "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   one or more output circuits, each output circuit configured (i) to receive a data input and a plurality of configuration inputs and (ii) to configure a bond pad connected to said output circuit as any of an input/output pad, a power pad, and a ground pad in response to said plurality of configuration inputs.

2. The apparatus according to claim 1, wherein each of said output circuits comprises:
   a first circuit configured to connect said bond pad to a first or a second internal power supply node in response to a first control input and a second control input; and
   a second circuit configured to generate said first and said second control inputs in response to a logical combination of said data input and said plurality of configuration inputs.

3. The apparatus according to claim 2, wherein said second circuit is implemented using combinational logic in a macrocell.

4. The apparatus according to claim 2, wherein said first circuit comprises a CMOS transistor pair.

5. The apparatus according to claim 4, wherein said first circuit further comprises a diode coupled between a drain and a source of each transistor of said CMOS transistor pair.

6. The apparatus according to claim 2, wherein said first circuit comprises a plurality of first MOS transistors and a plurality of second MOS transistors.

7. The apparatus according to claim 6, wherein each of said first and second MOS transistors is independently controlled by said first or second control input, respectively.

8. The apparatus according to claim 6, wherein each of said first and second MOS transistors is either switched on or off in response to said plurality of configuration inputs and said data input.

9. The apparatus according to claim 8, wherein each of said first and second MOS transistors is sequentially switched on or off in response to said plurality of configuration inputs and said data input.

10. The apparatus according to claim 6, wherein said first and second control signals comprise multi-bit signals.

11. The apparatus according to claim 10, wherein each of said first and second MOS transistors is controlled in response to an individual bit of said first or said second control signal.

12. The apparatus according to claim 6, wherein:
   said plurality of first MOS transistors comprises PMOS transistors; and
   said plurality of second MOS transistors comprises NMOS transistors.

13. The apparatus according to claim 2, wherein said first circuit is configured to control a resistance of said bond pad.

14. The apparatus according to claim 1, wherein said output circuit comprises an output portion of an input/output buffer of an integrated circuit.

15. The apparatus according to claim 1, wherein said apparatus comprises a programmable logic device (PLD).

16. The apparatus according to claim 1, wherein said apparatus comprises a memory device.

17. The apparatus comprising:
   means for connecting a bond pad to a first or a second internal power supply node in response to a first control input and a second control input; and
   means for generating said first and said second control inputs in response to a data input and a plurality of configuration inputs, wherein said bond pad is configurable as any of an input/output pad, a power pad, and a ground pad in response to said plurality of configuration inputs.

18. A method of configuring otherwise unused MOS output transistors as active clamps between an external output power supply and an internal output power supply node so as to suppress noise comprising the steps of:
   (A) connecting a bond pad to a first or a second internal power supply node in response to a first control input and a second control input; and
   (B) generating said first and said second control inputs in response to a data input and a plurality of configuration inputs, wherein said bond pad is configurable as any of an input/output pad, a power pad, and a ground pad in response to said plurality of configuration inputs.

19. The method according to claim 18, further comprising the step of:
   (C) configuring said bond pad (i) as a power pad when connected to an external voltage supply plane or an external ground plane and (ii) as an input/output pad when connected to an external circuit.

20. The method according to claim 18, wherein the step (A) comprises:
   (A-1) controlling a number of connections between said bond pad and said first internal output power supply node in response to said first control input; and
   (A-2) controlling a number of connections between said bond pad and said second internal output power supply node in response to said second control input.

* * * * *